(12) United States Patent
Divan et al.

(10) Patent No.: US 9,568,512 B2
(45) Date of Patent: Feb. 14, 2017

(54) VOLTAGE SENSOR SYSTEMS AND METHODS

(71) Applicant: Georgia Tech Research Corporation, Atlanta, GA (US)

(72) Inventors: Deepakraj M. Divan, San Jose, CA (US); Rohit Moghe, Atlanta, GA (US); Franklin C. Lambert, Palmetto, GA (US); Amrit Iyer, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 63 days.

(21) Appl. No.: 14/394,107

(22) PCT Filed: Apr. 17, 2013

(86) PCT No.: PCT/US2013/036957
§ 371 (c)(1),
(2) Date: Oct. 13, 2014

(87) PCT Pub. No.: WO2013/158754
PCT Pub. Date: Oct. 24, 2013

(65) Prior Publication Data
US 2015/0077088 A1    Mar. 19, 2015

Related U.S. Application Data

(60) Provisional application No. 61/625,411, filed on Apr. 17, 2012.

(51) Int. Cl.
*G01R 19/00* (2006.01)
*G01R 19/25* (2006.01)
*H04B 3/46* (2015.01)

(52) U.S. Cl.
CPC ............. *G01R 19/2506* (2013.01); *H04B 3/46* (2013.01)

(58) Field of Classification Search
CPC .. G01R 19/0092; G01R 1/203; G01R 31/2642
(Continued)

(56) References Cited

U.S. PATENT DOCUMENTS 4,891,576 A * 1/1990 Jacobs .................... G01P 13/00
324/457
5,432,438 A   7/1995 Baumgartner et al.
(Continued)

OTHER PUBLICATIONS

The International Preliminary Report on Patentability in related PCT Application No. PCT/US2013/036957; mailed Oct. 21, 2014.
(Continued)

*Primary Examiner* — Tung X Nguyen
*Assistant Examiner* — Dominic Hawkins
(74) *Attorney, Agent, or Firm* — Troutman Sanders LLP; Ryan A. Schneider; Andrew C. Doherty

(57) ABSTRACT

An exemplary embodiment of the present invention provides a floating voltage sensor system comprising a metallic enclosure, a conductive sensor plate, a signal conditioning circuit, and a microcontroller unit. The metallic enclosure can be configured for electrical communication with an asset carrying a voltage. The conductive sensor plate can be positioned adjacent to a surface of the metallic enclosure, such that the conductive plate and the surface of the metallic enclosure are not in contact with each other. The signal conditioning circuit can comprise a first connection point and a second connection point. The first connection point can be in electrical communication with the conductive sensor plate. The second connection point can be in electrical communication with the metallic enclosure. The microcontroller unit can be configured to receive an output of the signal conditioning circuit and measure the voltage of the asset.

16 Claims, 8 Drawing Sheets

(58) Field of Classification Search
USPC .......................................... 324/76.11, 73, 72
See application file for complete search history.

(56) References Cited

U.S. PATENT DOCUMENTS

| | | | | |
|---|---|---|---|---|
| 6,677,743 | B1* | 1/2004 | Coolidge | G01R 15/16 |
| | | | | 324/126 |
| 2003/0146756 | A1* | 8/2003 | Yugo | G01R 19/0092 |
| | | | | 324/444 |
| 2005/0286190 | A1* | 12/2005 | Rostron | G01R 15/142 |
| | | | | 361/65 |
| 2007/0035408 | A1* | 2/2007 | Roberts | G10H 1/0008 |
| | | | | 340/815.45 |
| 2010/0283487 | A1* | 11/2010 | Juds | G01R 15/16 |
| | | | | 324/688 |
| 2011/0001549 | A1* | 1/2011 | Van Gastel | H03K 17/955 |
| | | | | 327/517 |
| 2012/0302182 | A1* | 11/2012 | Coutelou | G01D 21/00 |
| | | | | 455/78 |

OTHER PUBLICATIONS

The International Search Report in priority application PCT/US2013/036957 mailed Jul. 10, 2013.

\* cited by examiner

VOLTAGE SENSOR SYSTEMS AND METHODS

CROSS-REFERENCE TO RELATED APPLICATIONS

This application is a 35 U.S.C. §371 U.S. National Stage of International Application No. PCT/US2013/036957 filed 17 Apr. 2013, which claims the benefit of U.S. Provisional Application Ser. No. 61/625,411, filed on 17 Apr. 2012, the entire contents and substance of which are hereby incorporated by reference in their entireties as if fully set forth below.

TECHNICAL FIELD OF THE INVENTION

The various embodiments of the present disclosure relate generally to voltage sensing systems and methods. More particularly, the various embodiments of the present invention are directed to floating voltage sensing and methods for high voltage assets.

BACKGROUND OF THE INVENTION

The ability to measure the voltage carried by an asset, e.g., a conductor, can be especially important to electric utility companies. Conventionally, voltage measurement of high voltage assets up to 765 kV was accomplished through the use of potential transformers ("PTs") and capacitively coupled voltage transformers ("CCVTs"). As shown in FIG. 1, a CCVT comprises a capacitor divider circuit, and the voltage induced on both the capacitors is proportional to the asset voltage. Thus, the asset voltage can be determined by measuring the voltage across one of the capacitors. However, as this technique requires two physically connected capacitors across a high voltage asset and ground, it has stringent insulation requirements. This requirement increases the design challenges, size, and cost of these sensors. Accordingly, it is presently not possible to use this technology for voltage sensing in low-cost sensors.

To reduce the insulation requirements of the voltage sensor, the sensor can be floated at the same potential as the asset, as shown in FIGS. 2A-2B. In this case, the air between the sensing plate $S_1$ and the ground acts as a dielectric medium between capacitance to ground. The capacitor $C_1$ is then used to measure the voltage of the conductor. A low impedance integrating amplifier between the sensing plate and the conductor can be added which brings the sensing plate to the asset potential and effectively eliminates $C_1$ from the circuit. The displacement current in capacitor $C_2$ flows through $C_F$ of the op-amp and results in a voltage output across the op-amp which is directly proportional to the asset voltage. A major drawback that ensues with this approach pertains to the deposition of water drops or snow on the sensing plate, changing the displacement current flowing through the op-amp. To minimize the errors due to this effect, the width and length of the sensing plate has to be very large as compared to the gap between the two sensing plates. This approach, however, is not immune to the effect of tree branches in the vicinity of the asset or the presence of multiple assets in the vicinity. Moreover, the physical geometry requirements to reduce spurious external effects are demanding and tend to increase the overall size of the sensor.

To tackle the effects of vegetation, distance to ground, and nearby assets, another conventional sensor uses a circular array of capacitor plates as shown in FIG. 3. The primary idea behind this technique is the use of multiple capacitors (six capacitor plates) for eliminating the effects due to external conditions in voltage measurements. The displacement current flowing through each of the capacitor plates has information embedded in it related to external conditions, such as geometry of nearby conductors and vegetation. This approach, however, suffers from a major drawback in that it requires six capacitor plates distributed in space encircling the conductor which increases the size of the sensor. Moreover, this approach can only be used with conductors and does not have the flexibility of being used in conjunction with other assets. Furthermore the algorithms are fairly involved and require increased computation power to solve for the voltage, phase angle, and conductor clearance. This increased computation demands more power for operating the sensor, and is a cause for concern in a self-powered low-cost sensing application. In addition, the algorithms are based on the premise that the conductor is part of a three-phase system and cannot operate in a single-phase electrical system.

These conventional sensors make the use of a floating sensor on a high voltage asset look promising as they are free from high voltage insulation requirements. These sensors, however suffer from at least the following limitations: most of the sensors require field calibration that is very expensive; the construction of the sensor is challenging; the algorithms used to compute the voltage is complex and requires a lot of computing power; the implementation of the sensor in a low-power module is difficult; the sensors are constrained in their application (limited to three-phase systems); and the sensors are sensitive to variations in distance to ground, nearby assets, electric fields from nearby assets, and changes in atmospheric conditions. Additionally, these conventional solutions aim at developing voltage sensors for revenue grade metering applications. In such applications, the errors are required to be on the orders of 0.1-1%. Therefore, there exists a gap in the opportunity space for applications that require moderate accuracy of voltage sensing.

Therefore, there is a desire for voltage sensor systems and methods that address one or more of the disadvantages discussed above. Various embodiments of the present invention address these desires.

BRIEF SUMMARY OF THE INVENTION

The present invention relates to voltage sensors. An exemplary embodiment of the present invention provides a floating voltage sensor system comprising a metallic enclosure, a conductive sensor plate, a signal conditioning circuit, and a microcontroller unit. The metallic enclosure can be configured for electrical communication with an asset carrying a voltage. The conductive sensor plate can be positioned adjacent to a surface of the metallic enclosure, such that the sensor plate and the surface of the metallic enclosure are not in contact with each other. The signal conditioning circuit can comprise a first connection point and a second connection point. The first connection point can be in electrical communication with the conductive sensor plate. The second connection point can be in electrical communication with the metallic enclosure. The microcontroller unit can be configured to measure the voltage of the asset based on an output of the signal conditioning circuit.

In some embodiments of the present invention, an electrical voltage ground of the signal conditioning circuit is the voltage of the asset.

In some embodiments of the present invention, the voltage sensor further comprises an insulator positioned substantially between the metallic enclosure and the conductive sensor plate.

In some embodiments of the present invention, the signal conditioning circuit comprises a rectifier circuit, a voltage follower circuit, and a low pass filter. The rectifier circuit can be configured to rectify an AC voltage induced on the conductive sensor plate. The voltage follower circuit can be configured to buffer an output of the rectifier circuit. The low pass filter can be configured to low pass filter an output of the voltage follower circuit.

In some embodiments of the present invention, the voltage sensor further comprises a wireless transceiver in communication with the microcontroller unit. The wireless transceiver can be configured to transmit a wireless signal indicative of the measured voltage of the asset.

In some embodiments of the present invention, the microcontroller unit comprises a memory and processor. The memory can comprise logical instructions that when executed by the processor cause the microcontroller to calculate the voltage of the asset and calculate a distance of the asset from a surface of the Earth. In some exemplary embodiments of the present invention, the logical instructions are such that the calculations of the voltage of the asset and the distance of the asset from the surface of the Earth are based in part on a voltage across the surface of the metallic enclosure and the conductive sensor plate.

In some embodiments of the present invention, the voltage sensor further comprises a power supply circuit configured to receive electric power from the asset and provide electric power to the floating voltage sensor.

In some embodiments of the present invention, the signal conditioning circuit and the microcontroller unit are contained substantially within the metallic enclosure.

In some embodiments of the present invention, the floating voltage sensor is completely supported by the asset.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

To facilitate an understanding of the principles and features of the present invention, various illustrative embodiments are explained below. To simplify and clarify explanation, the invention is described below as applied to voltage sensors for sensing voltage on high voltage assets, such as electric power transmission lines. One skilled in the art will recognize, however, that the invention is not so limited. Instead, as those skilled in the art would understand, the various embodiments of the present invention also find application in other areas where it is desired to measure the voltage carried by an asset.

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

Figure 1:
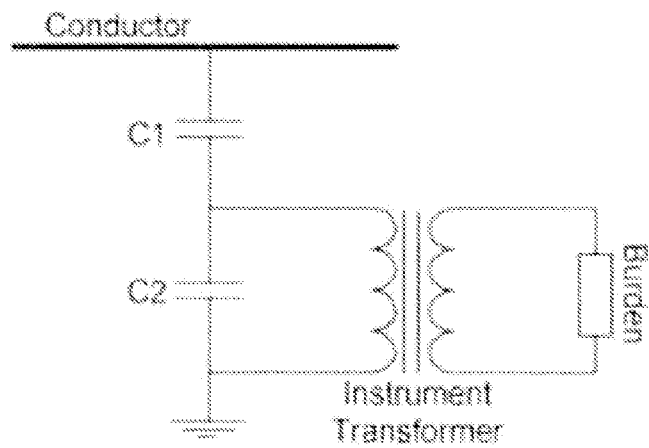
FIG. 1 provides a circuit diagram of a conventional voltage sensor.
Figure 2A:
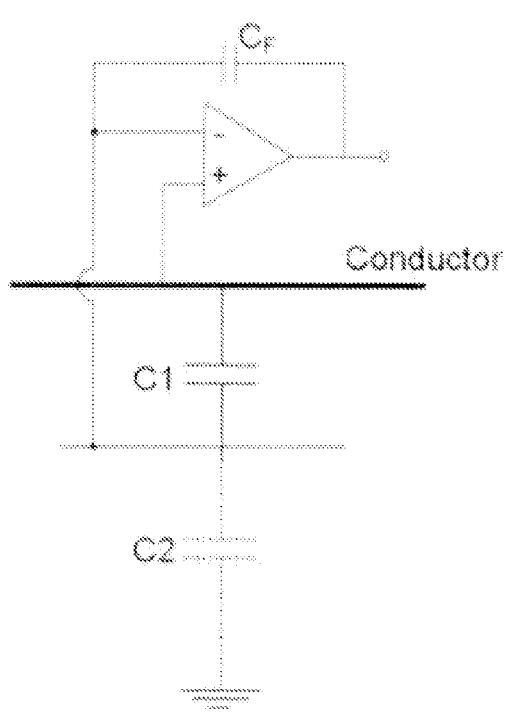
FIGS. 2A-2B provide circuit diagrams of conventional voltage sensors.
Figure 2B:
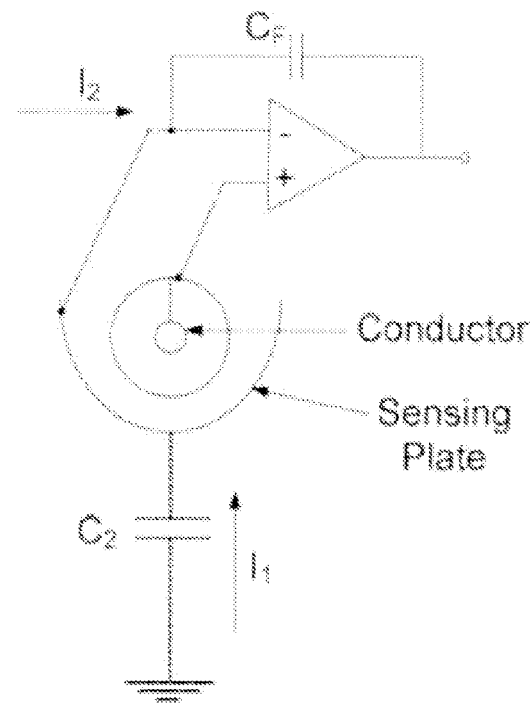
Figure 3:
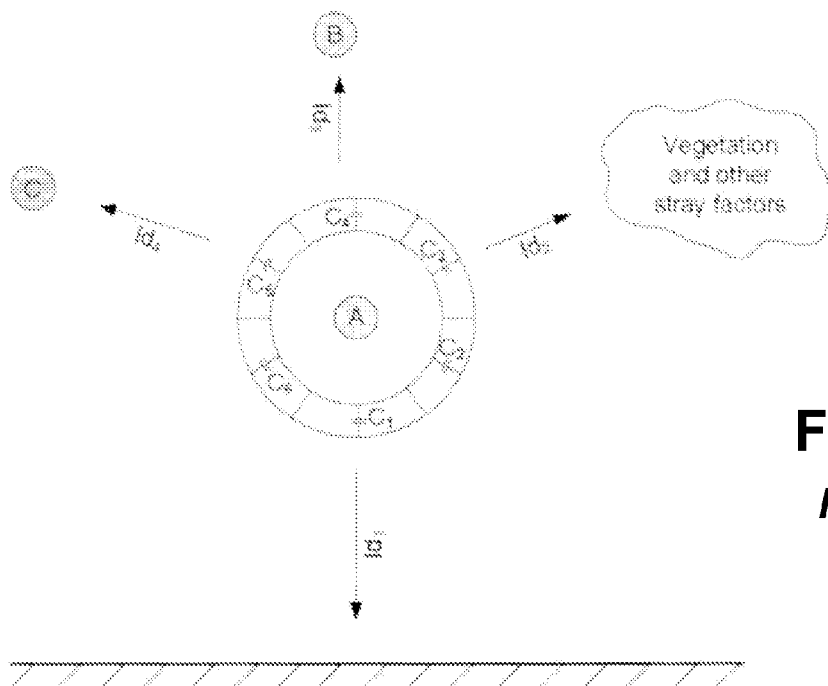
FIG. 3 provides a circuit diagram of a conventional voltage sensor.
Figure 4:
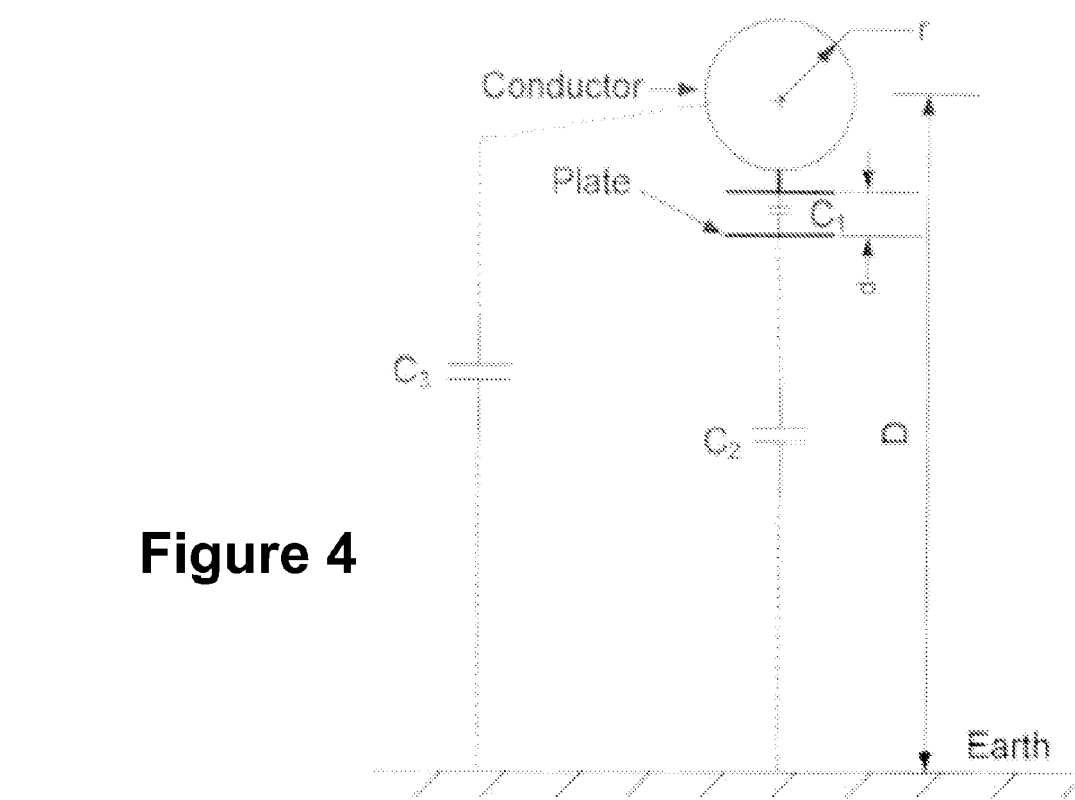
FIG. 4 provides a model of a voltage sensor on single phase asset, in accordance with an exemplary embodiment of the present invention.

To reduce the costs of conventional PTs and CCVTs by orders of magnitude, some embodiments of the present invention provide a floating voltage sensor that can physically and electrically float on an asset, which can reduce the insulation requirements, and therefore cost. Consider the voltage sensor floating from a conductor shown with a configuration as shown in FIG. 4. In a typical transmission line, D will be much larger than d. This can result in $C_1$ being very large as compared to $C_2$. Further, consider an RC filter used across the capacitor $C_1$ for measuring the voltage across $C_1$. Then, the value of displacement current can be given by Equation 1.

$$i_D = \frac{V_1}{\frac{1}{j\omega C_2} + \frac{1}{j\omega(C_1+C)R}}$$ Equation 1

Given that $\omega CR$ is designed to be much greater than 1, $C \gg C_1$ and $C_1 \gg C_2$, $i_D$ simplifies to Equation 2.

$$i_D = j\omega C_2 V_1$$ Equation 2:

The voltage measured across capacitor $C_2$ can be shown by Equation 3.

$$V_{c1} = i_D \frac{R}{1+j\omega CR}$$ Equation 3

But if $\omega CR \gg 1$, $V_{C1}$ simplifies as shown in Equation 4.

$$V_{c1} = \frac{C_2}{C} V_1$$ Equation 4

In Equation 4, it can be seen that the voltage across capacitor $V_{C1}$ is directly proportional to the line voltage $V_1$ and Capacitance $C_2$ between the lower plate and the earth. Further $C_2$ is a function of the distance of the conductor from the ground. A decrease (increase) in the distance is increases (decreases) the capacitance, thus changing the voltage measured. Therefore, the information on sag of the conductor and its voltage can be embedded in the measured voltage $V_{C1}$. The task of decoupling the voltage of the conductor from the capacitance $C_2$, however, is not trivial.

Figure 5:
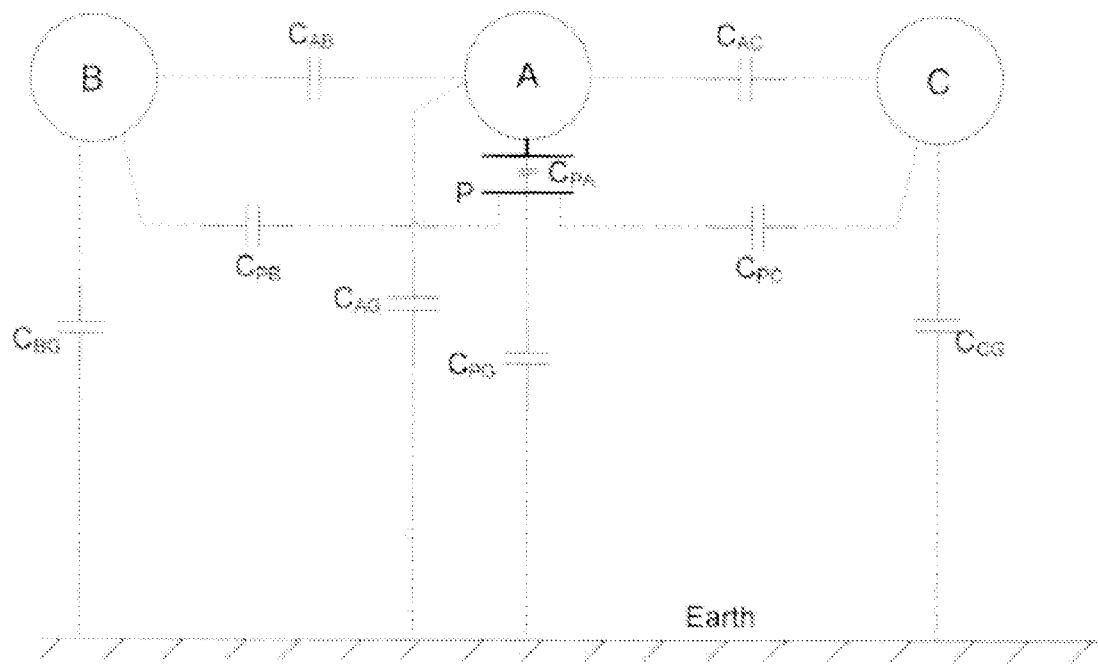
FIG. 5 provides model of a voltage sensor on a three-phase asset, in accordance with an exemplary embodiment of the present invention.
Figure 6:
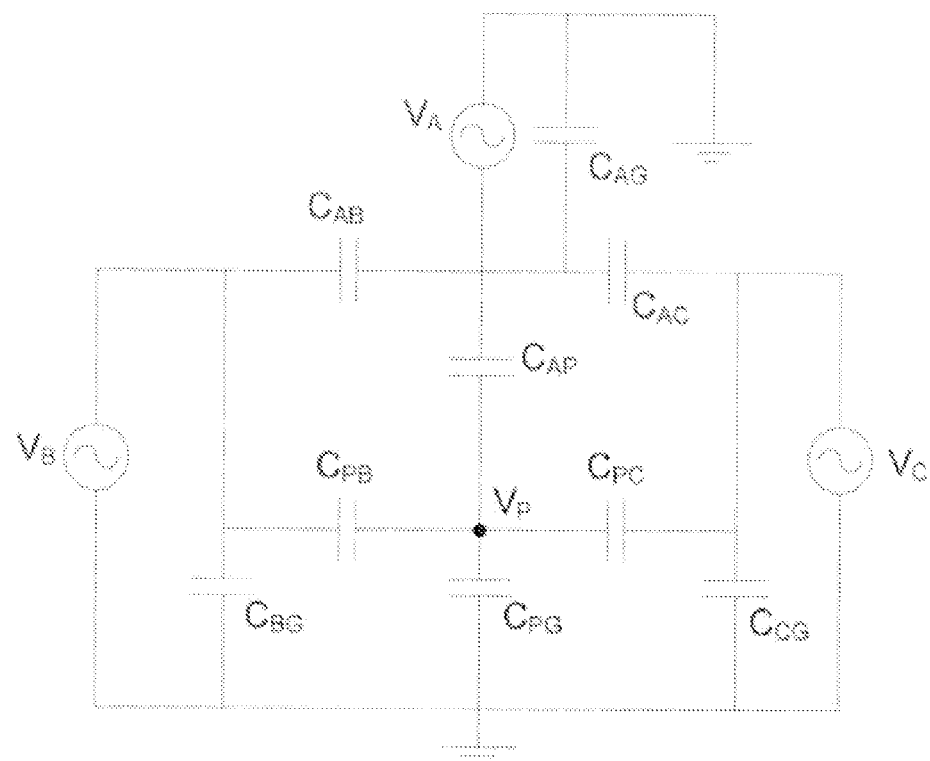
FIG. 6 provides electrical equivalent model of for the voltage sensor shown in FIG. 5, in accordance with an exemplary embodiment of the present invention.

In some electric systems, there are three conductors for the three phases, each carrying AC currents separated in phase by 120°. Therefore, the other conductors may also have an influence on the displacement current flowing through capacitor $C_2$. Modeling the effects of other conductors on the capacitor $C_2$ can be quite complex. FIG. 5 provides the configuration of the considered system, and FIG. 6 provides the electrical model of the system. A, B, and C represent the three phase conductors, and P represents a sensor plate used to sense the voltage of conductor A.

Using nodal analysis, the voltage at P can be found and given by Equation 5.

$$V_P = \frac{V_A C_{PA} + V_B C_{PB} + V_C C_{PC}}{C_{PA} + C_{PB} + C_{PC} + C_{PG}}$$ Equation 5

$V_A$, $V_B$, and $V_C$ are phasor voltages given by $V_A = V$, $V_B = V e^{-j120}$, and $V_C = V e^{j120}$.

Replacing the phasor values of $V_A$, $V_B$, and $V_C$ in Equation 5 yields Equation 6:

$$V_P = V \left| \frac{(C_{PA} - (C_{PB} + C_{PC})/2) + j\sqrt{3}(C_{PB} + C_{PC})/2}{C_{PA} + C_{PB} + C_{PC} + C_{PG}} \right|$$ Equation 6

Another simplification that can be applied to Equation 6 is that $C_{PA} \gg C_{PB}$, $C_{PC}$, $C_{PG}$. Using this assumption, Equation 6 reduces to Equation 7.

$$V_P \cong V$$ Equation 7

The current in capacitor $C_{PG}$, $C_{PB}$, $C_{PC}$ can be found with Equations 8, 9, and 10, respectively.

$$I_{PG} = j\omega C_{PG} V_P = j\omega C_{PG} V$$ Equation 8:

$$I_{PB} = j\omega C_{PB}(V - V e^{-j120}) = \sqrt{3} \omega C_{PB} V e^{j120}$$ Equation 9:

$$I_{PC} = j\omega C_{PC}(V - V e^{j120}) = \sqrt{3} \omega C_{PC} V e^{j60}$$ Equation 10:

The current flowing from conductor A to plate P, which charges the capacitor $C_{AP}$, can be given as the sum of displacement current flowing in the neighboring conductors and to the ground as shown in Equation 11.

$$I_{PA} = I_{PG} + I_{PC} + I_{PB}$$ Equation 11:

The use of Equations 8-10 simplifies $I_{PA}$ as shown in Equation 12.

$$I_{PA} = \omega V \left( \frac{\sqrt{3}}{2}(C_{PC} - C_{PB}) + j\left(C_{PG} + \frac{3}{2}(C_{PC} + P_{PB})\right) \right)$$ Equation 12

The voltage across the two plates of the capacitor can be found using Equation 13.

$$V_{AP} = \frac{I_{AP}}{j\omega C_{PA}}$$ Equation 13

Plugging the value of $I_{AP}$ from Equations 12 and 13 yields Equation 14.

$$V_{PA} = \frac{V}{C_{PA}} \left( C_{PG} + \frac{3}{2}(C_{PG} + C_{PB}) + j\frac{\sqrt{3}}{2}(C_{PB} - C_{PC}) \right)$$ Equation 14

$V_{PA}$ is the voltage across the plates being sensed to estimate the value of the voltage of the conductor A. In Equation 14, $C_{PG}$ is a function of the distance of the plate to ground, while $C_{PB}$ and $C_{PC}$ are a function of distance of the plate from conductor B and C, respectively. The voltage $V_{PA}$ contains information on the voltage of the conductor and its distance from the ground with the additional information on its distance from the other conductors.

Figure 7:
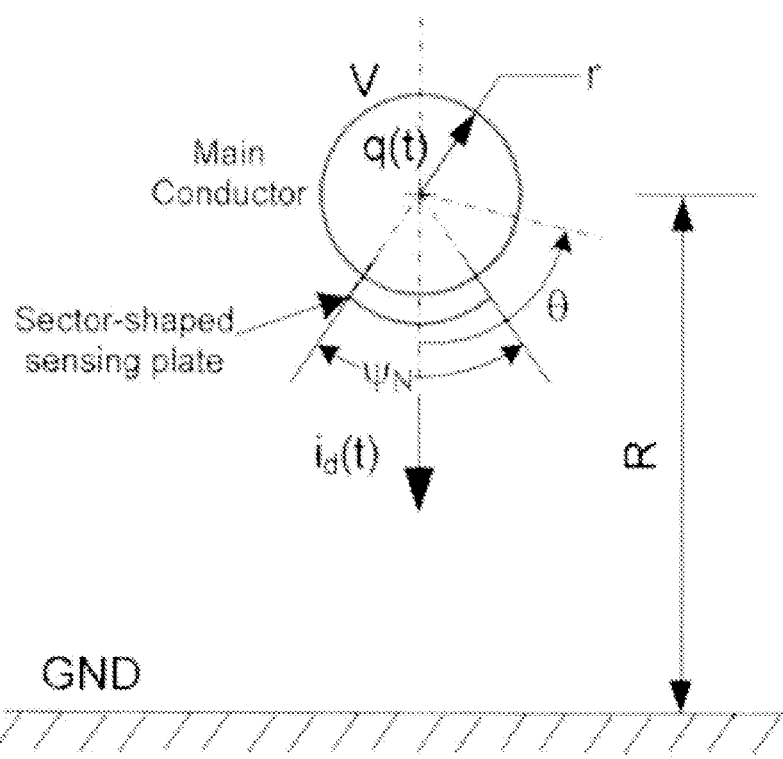
FIG. 7 provides model of a voltage sensor single-phase asset, in accordance with an exemplary embodiment of the present invention.

A mathematical model of the relationship between the displacement current and the asset voltage can also be shown. Consider a single conductor above the earth as shown in FIG. 7. The sensor plate is in the form of a sector, having a sector angle given by $\psi_N$, and the radial distance of the sectored sensor from the center of the conductor is r. Further, the value of r is very close to the radius of the conductor, and very small as compared to the distance of the conductor above the earth, R, i.e., $R \gg r$.

It can be desired to find the displacement current produced by the conductor $i_d(t)$ as a function of r, R, $\psi_N$, and the voltage of the asset V. This can be done by solving the Laplace differential in Equation 15.

$$\frac{1}{\rho}\frac{\partial}{\partial \rho}\left(\rho \frac{\partial \Phi}{\partial \rho}\right) + \frac{1}{\rho^2}\frac{\partial^2 \Phi}{\partial \theta^2} = 0$$ Equation 15

A solution to Equation 15 has a general solution shown by Equation 16.

$$\Phi(\rho, 0) = \left(A\rho^m + \frac{B}{\rho^m}\right)(C\cos(m\theta) + D\sin(m\theta)),$$ Equation 16

$m = 1, 2, 3 \ldots$

An alternate approach is to use the method of images, whereby the earth is considered to be an infinite plane having an infinite conductance. Any charged surface above the earth will have an image having a negative charge below the earth at an equal distance from the earth's surface. The electric fields inside the earth are zero as it is a perfect conductor and exist only above the earth. The expression obtained for the displacement current can be shown by Equation 17.

$$i_d(t) = \frac{\psi_N l \varepsilon d}{R \ln\left|\frac{R-r+d}{R-r-d}\right|}\left(1 + \frac{r}{R}\cos\theta\right)\frac{dV}{dt} \quad \text{Equation 17}$$

In Equation 17, $d = \pm\sqrt{R^2 - r^2}$, $\psi_N = 2\pi/N$ is the angular length of the voltage sensor plate, N is a number greater than one, $\theta$ is the angular displacement, and l is the length of the sensor.

If $V = V_m \sin(\omega t)$, Equation 17 can be written as Equation 18.

In terms of phasor quantities, the expression of the displacement current is shown by Equation 19.

Figure 8:
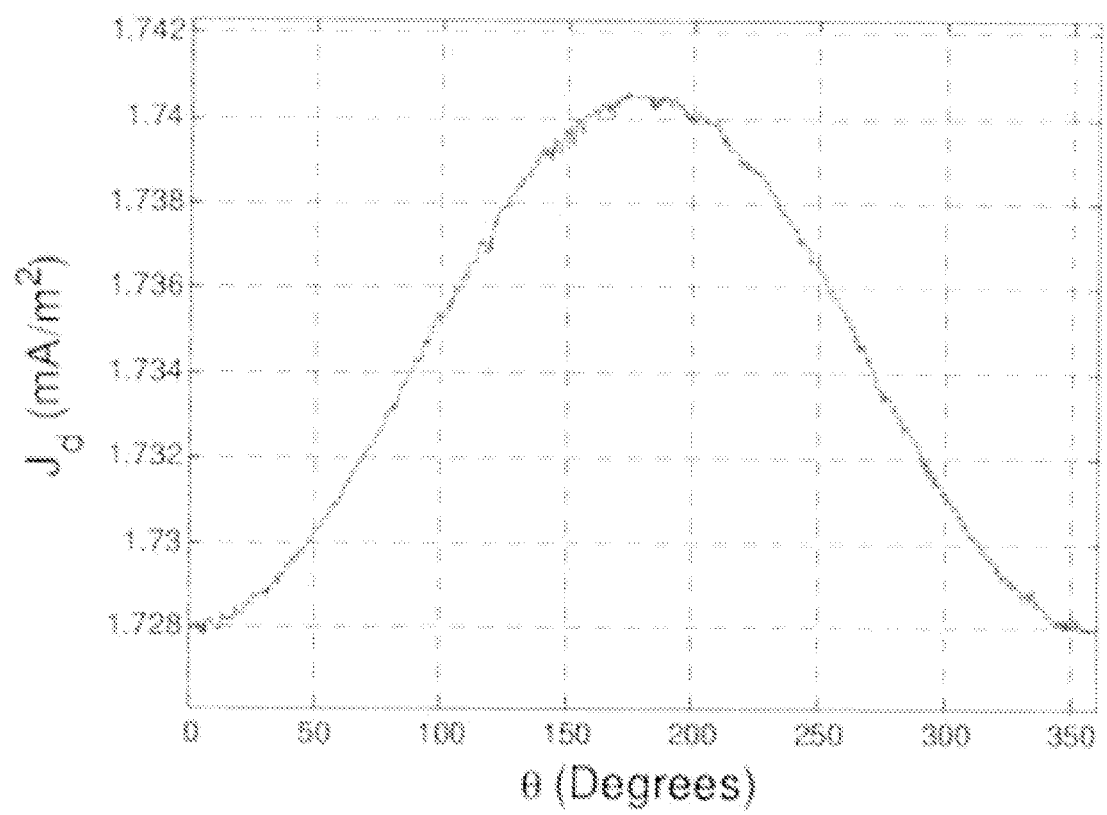
FIG. 8 provides an illustration of displacement current variation with spatial angle, in accordance with an exemplary embodiment of the present invention.

The nature of displace current variation with spatial angle around the conductor was validated using an FEA simulation through ANSYS Maxwell as shown in FIG. 8.

The variation of displacement current with a change in the angular position $\theta$ can be used to estimate the value of voltage. This variation, however, can be difficult to detect and implement. Take the example of FIG. 8. The peak-to-peak variation of the displacement current density is on the order of 10 $\mu A/m^2$, which is already small to detect. Detecting a 10% variation in the displacement current density would imply detecting a change of 1 $\mu A/m^2$ of displacement current density, even more difficult to measure. Therefore, some embodiments of the present invention use the average value of the displacement current rather than the variation. If the assumption that R>>r is true, Equation 19 reduces to its average value shown in Equation 20, which is shown in phasor quantities in Equation 21.

$$i_d \simeq \frac{\psi_N l \varepsilon \omega}{\ln\left|\frac{2R}{r}\right|} V_m \cos(\omega t) \quad \text{Equation 20}$$

$$\tilde{I}_d = j\frac{\psi_N l \varepsilon \omega}{\ln\left|\frac{2R}{r}\right|} \tilde{V} \quad \text{Equation 21}$$

Equation 21 can be represented as Equation 22.

$$\tilde{I}_d = Y\tilde{V} \quad \text{Equation 22:}$$

Equation 22 can be used to estimate the value of voltage on the conductor. Equation 22, however, has essentially three variable, voltage, distance of the conductor from the earth, and electrical permittivity. Without any knowledge of the two variables, it may not be possible to estimate the third. If can be assumed that the electrical permittivity does not change dramatically and can be considered fairly constant over a given period of time. Even then, the equation has two unknowns and only one equation to solve for the unknowns. Therefore, some embodiments of the present invention can use historical data saved over time in the sensor memory to estimate the present voltage. This is better understood with knowledge of typical voltage and distance profiles.

For a given class of overhead conductors or a utility asset, the mean RMS voltage is constant over long periods of time. In reality, the RMS voltage has a maximum of 5% variation over time, but on a large time scale, the averaging of the RMS voltage gives a fixed known value. Further, an inherent variability at any time is always present in the RMS voltage of the asset and is on the order of 1% to 5%.

The variation in the distance of the conductor above the earth occurs due to either heating of the conductor or galloping in the presence of strong winds. Heating of the conductor is dependent on the loading of the line, ambient and conductor temperature and wind speed. The tie constant of heating is large, and a considerable variation occurs typically over longer durations. For instance, a variation of a few centimeters might occur over a period of several hours.

On the other hand, galloping of the conductor due to strong winds leads to fast changes in the distance of the conductor above ground. These changes, however, are limited due to the tension on the conductor. Whereas, heating causes more pronounced changes in the distance of the conductor to ground. Moreover, in other applications, such as voltages sensing in transformers, and capacitor banks, the changes in distance of the high voltage bushing may not be a prominent issue. Therefore, it is fair to assume that the change in distance occurs slowly as compared to the variability in voltage. Over the course of a day, this change could be linearly decreasing, linearly increasing, or sinusoidally varying, depending on whether the temperature of the conductor is linearly increasing, decreasing or is a combination of both.

Various embodiments of the present invention find application with both single phase and three phase electric systems. An exemplary algorithm is provides that uses a window of width w, which spans over the collected data points over time and uses the averaged information over the window to compute the present results. A windowed average of size w taken at the $n^{th}$ interval spanning all data points from $(n-w+1)^{th}$ to $n^{th}$ sample gives Equation 23.

$$\langle \tilde{I}_d \rangle_{n,w} = \langle Y\tilde{V} \rangle_{n,w} \quad \text{Equation 23}$$

In Equation 23, $\langle p \rangle_{n,w} = \frac{\sum_{k=n-w+1}^{n} p_i}{w}$.

Figure 9:
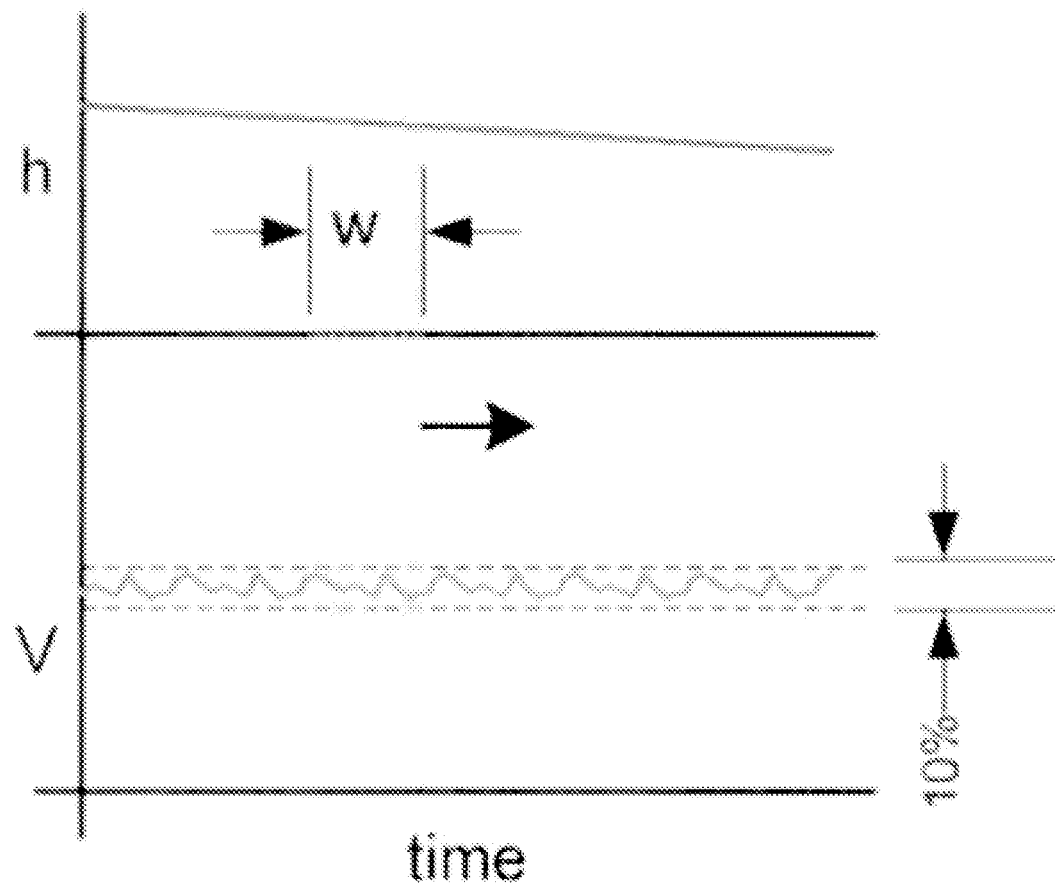
FIG. 9 provides a comparison of the variation of voltage and height of an overhead conductor, in accordance with an exemplary embodiment of the present invention.

The moving windowed averaging of data points is depicted in FIG. 9.

Over a relatively small window, the variation in Y is not large, and $Y_n$ can be assumed constant over the window length, which gives Equation 24.

$$\langle \tilde{I}_d \rangle_{n,w} = Y_n \langle \tilde{V} \rangle_{n,w} \quad \text{Equation 24:}$$

Inverting V gives the estimated value of $Y_n$ as shown in Equation 25.

$$Y_n = \langle \tilde{I}_d \rangle_{n,w} \langle \tilde{V} \rangle_{n,w}^{-1} \quad \text{Equation 25:}$$

The average value of $I_d$ over the specified window can be computed if the past data of $I_d$ was saved. The realistic assumption that the average voltage of the line over a period of time remains constant can be used to get an estimate of Y as shown in Equations 26 and 27.

$$\langle \tilde{V} \rangle_{n,w} = V_{class} \quad \text{Equation 26}$$

$$\hat{Y}_n = \frac{\langle \tilde{I}_d \rangle_{n,w}}{V_{class}} \quad \text{Equation 27}$$

Subsequently, at the $(n+1)^{th}$ measurement index, the update-expressions for all the parameters can be given by Equations 28-30.

$$\hat{Y}_{n+1} = \hat{Y}_n + \frac{\left(\frac{\tilde{I}_{d_{n+1}} - \tilde{I}_{d_{n-\omega+1}}}{\omega}\right)}{V_{class}} \quad \text{Equation 28}$$

$$\hat{V}_{n+1} = \left(\frac{\tilde{I}_{d_{n+1}}}{\hat{Y}_{n+1}}\right) \quad \text{Equation 29}$$

$$\hat{R}_{n+1} = \frac{r}{2}\exp\left(\frac{\psi_N l \varepsilon \omega}{\hat{Y}_{n+1}}\right) \quad \text{Equation 30}$$

Figure 10:
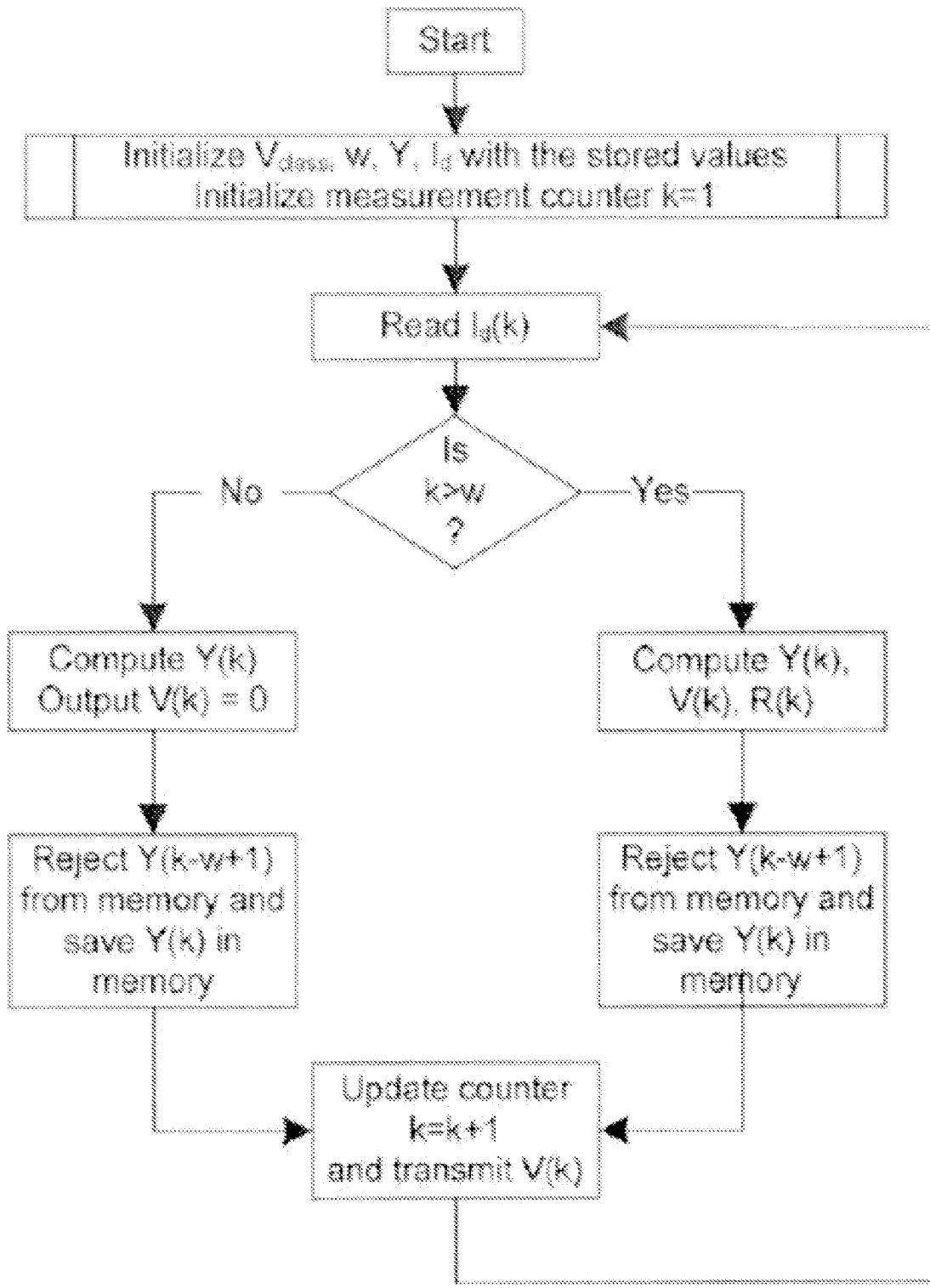
FIG. 10 provides a flow chart for implementing a MAVS algorithm on a microcontroller, in accordance with an exemplary embodiment of the present invention.

FIG. 10 provides an exemplary moving average voltage sensing ("MAVS") algorithm in accordance with an exemplary embodiment of the present invention, which can be used to compute the value of voltage carried by an asset and the distance from the asset to the earth for all measurement indices after the first window index. The sensor can be programmed to take multiple measurements at a relatively fast speed shortly after installation, and thereafter, slow down. This strategy can help reduce the time for convergence to a true solution.

Various embodiments of the present invention also find application to multi-phase systems, e.g., three-phase systems. A mathematical model of the voltage sensor for a multi-conductor case is shown in Equation 31.

$$\frac{dV_i}{dt} = \frac{1}{2\pi\varepsilon}\left[\sum_{k=1}^{n} I_{dk} \ln\left(\frac{1}{d_{ik}}\right)\right] \quad \text{Equation 31}$$

In Equation 31, $I_{dk}$ is the capacitive charging current flowing out of the kth conductor, $d_{ii}$, which equals $r_1$, is the radius of the $i_{th}$ conductor, $d_{ik}$ is the distance between the $i_{th}$ and $k_{th}$ conductor, and $v_i$ is the voltage carried by the $i_{th}$ conductor.

The derivation assumes that the charge distribution on the surface of the conductor is uniform, i.e., R>>r. Equation 31 can be converted to phasors by the assumptions in Equations 32-34.

$$V_i = \text{Re}\{\sqrt{2}\,\tilde{V}_i e^{j\omega t}\} \quad \text{Equation 32}$$

$$I_{di} = \text{Re}\{\sqrt{2}\,\tilde{V}_{di} e^{j\omega t}\} \quad \text{Equation 33}$$

$$\tilde{V}_i = \frac{1}{j\omega 2\pi\varepsilon}\left[\sum_{k=1}^{n} \tilde{I}_{dk} \ln\left(\frac{1}{d_{ik}}\right)\right] \quad \text{Equation 34}$$

The phasor equation can be written in the form of a matrix as shown in Equations 35 and 36.

$$\begin{bmatrix} \tilde{V}_1 \\ \tilde{V}_2 \\ \vdots \\ \tilde{V}_n \end{bmatrix} = \begin{bmatrix} x_{11} & x_{11} & \cdots & x_{1n} \\ x_{21} & x_{11} & \cdots & x_{21n} \\ \vdots & \cdots & \ddots & \vdots \\ x_{n1} & x_{n1} & \cdots & x_{nm} \end{bmatrix} \begin{bmatrix} \tilde{I}_{d1} \\ \tilde{I}_{d2} \\ \vdots \\ \tilde{I}_{dn} \end{bmatrix} \quad \text{Equation 35}$$

$$V = XI_d \quad \text{Equation 36}$$

The displacement current can be found in terms of V. For a balanced three-phase system, the displacement currents are expected to be balanced and are 120 degrees phase apart. The sequence component transformation can be used to simplify analysis. If a transformation T is defined as shown in Equation 37 where Equations 38, 39 and 40 are true, then Equation 41 is true.

$$T = \frac{1}{3}\begin{bmatrix} 1 & a & a^2 \\ 1 & a^2 & a \\ 1 & 1 & 1 \end{bmatrix} \quad \text{Equation 37}$$

$$a = e^{j\frac{2\pi}{3}} \quad \text{Equation 38}$$

$$V_{120} = TV_{abc} \quad \text{Equation 39}$$

$$I_{120} = TI_{abc} \quad \text{Equation 40}$$

$$V_{120} = TXT^{-1}I_{120} \quad \text{Equation 41}$$

X represents the symmetric matrix shown in Equation 42.

$$x_{12}=x_{21}, x_{32}=x_{23}, x_{13}=x_{31} \quad \text{Equation 42:}$$

To simplify computation of $TXT^1$, it can be assumed that $x_{11}=x_{22}=x_{33}=x_n$, i.e., the radius of all the conductors is substantially the same. Further, it can be assumed that $x_{12}=x_{23}=x_{13}=x_m$, i.e., all the other conductors are considered to be an equal distance $d_{eq}$, from the conductor of interest. Using these simplifications, $TXT^1$ reduces as shown in Equation 43.

$$TXT^{-1} = \begin{bmatrix} x_s - x_m & 0 & 0 \\ 0 & x_s - x_m & 0 \\ 0 & 0 & x_s - 2x_m \end{bmatrix} \quad \text{Equation 43}$$

Even if the assumptions are not considered, the off-diagonal elements of $TXT^1$ for almost any practical geometry of conductors can be negligible as compared to diagonal elements. Therefore, the expressions of the decoupled sequence components can be represented by Equations 44-46.

$$V_1 = I_1(x_s - x_m) \quad \text{Equation 44:}$$

$$V_2 = I_2(x_s - x_m) \quad \text{Equation 45:}$$

$$V_0 = I_0(x_s - 2x_m) \quad \text{Equation 46:}$$

Therefore, Equation 47 is true.

$$I_1 = j\frac{2\pi\omega\varepsilon V_1}{\left(\ln\frac{1}{r} - \ln\frac{1}{d_{eq}}\right)} = j\frac{2\pi\omega\varepsilon V_1}{\ln\frac{d_{eq}}{r}} \quad \text{Equation 47}$$

Under balanced operation, the magnitude of positive sequence component is the same as the magnitude of the abc phase components, and is given by Equation 48.

$$I_{rms} = \frac{2\pi\omega\varepsilon}{\ln\frac{d_{eq}}{r}}V_{rms} \qquad \text{Equation 48}$$

Therefore, the general form of Equation 48 is substantially the same as the expression for displacement current in a single conductor above the earth. Therefore, the MAVS algorithm for single-phase conductor systems can also work for three-phase systems. If the effect of the earth is taken into account, Equation 49 can be obtained.

$$\tilde{V}_i = \frac{1}{j\omega 2\pi\varepsilon}\left[\sum_{k=1}^{n}\tilde{I}_k \ln\left(\frac{d'_{ik}}{d_{ik}}\right)\right] \qquad \text{Equation 49}$$

In Equation 49, $d'_{ik}$ is the distance of the $i^{th}$ conductor from the image of the $k^{th}$ conductor.

To simplify analysis, it can be assumed that the images of all the conductors are lumped together to get an equivalent image at a distance $d'_{eqo}$ from all the other conductors. The equivalent distance of the conductor where the sensor is mounted from its own image is given by $d'_{eqs}$. Therefore, Equation 50 can be obtained.

$$I_1 = j\frac{2\pi\omega\varepsilon V_1}{\left(\ln\frac{d'_{eqs}}{r} - \ln\frac{d'_{eqo}}{d_{eq}}\right)} = j\frac{2\pi\omega\varepsilon V_1}{\ln\frac{d'_{eqs}d'_{eq}}{rd_{eqo}}} \qquad \text{Equation 50}$$

If it is assumed that $$D_{eq} = \frac{d'_{eqs}d_{eq}}{d_{eqo}},$$

then Equation 51 is true.

$$I_{rms} = \frac{2\pi\omega\varepsilon}{\ln\frac{D_{eq}}{r}}V_{rms} \qquad \text{Equation 51}$$

This exemplary algorithm discussed above for the case of a three-phase system can be used for many different multi-phase systems, not just three-phase systems.

Various voltage sensors provided by the present invention can be used to evaluate one or more of the various equations and algorithms discussed above to measure a voltage carried by an asset.

Figure 11:
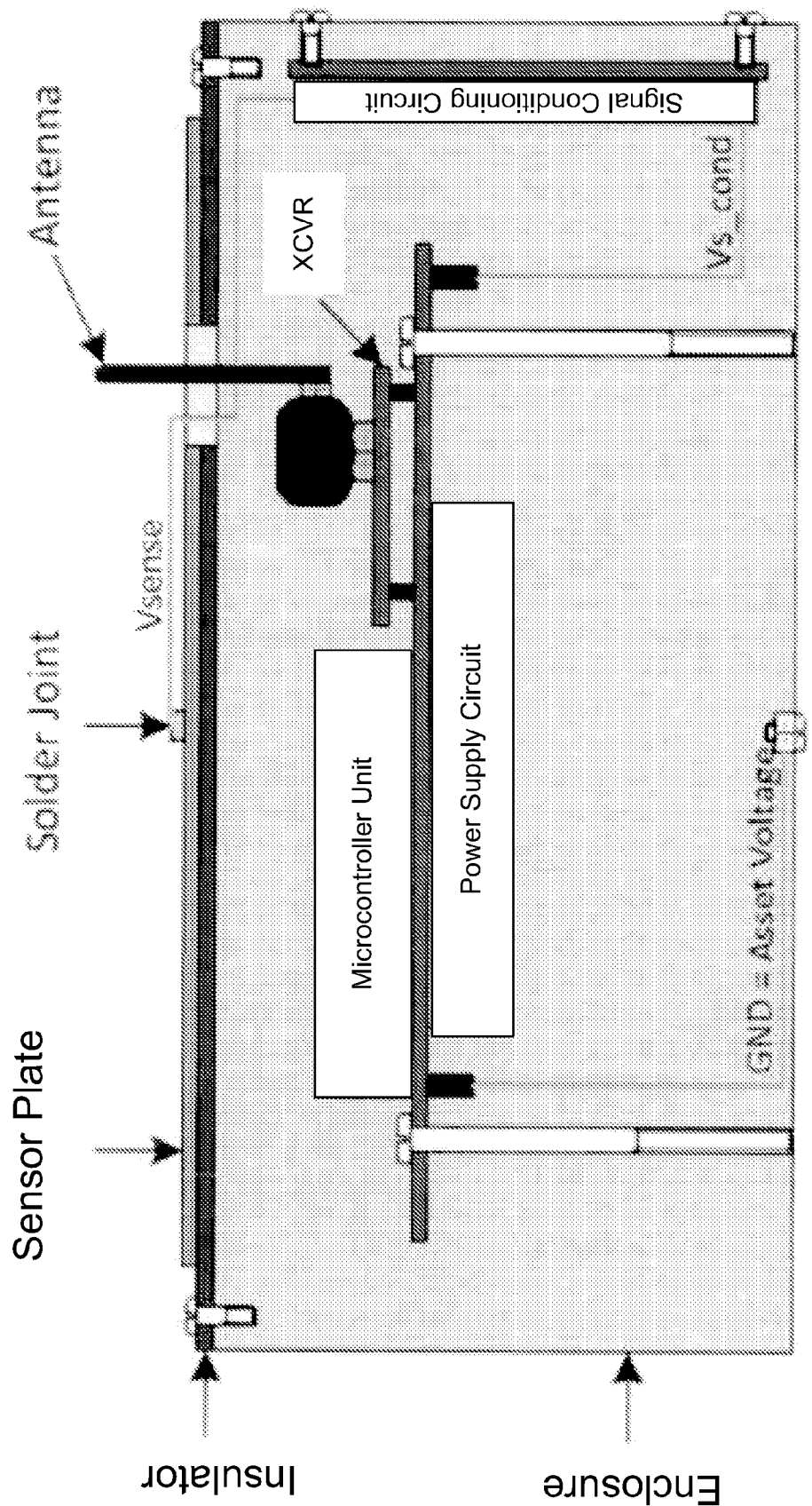
FIG. 11 provides a floating voltage sensor, in accordance with an exemplary embodiment of the present invention.

As shown in FIG. 11, an exemplary embodiment of the present invention provides a floating voltage sensor for measuring a voltage carried by an asset. The sensor comprises an enclosure, a conductive sensor plate, a signal conditioning circuit, and a microcontroller unit. The sensor can optionally also comprise a wireless transceiver.

The enclosure can be many enclosures known in the art and can comprise many different materials. In an exemplary embodiment of the present invention, the enclosure comprises a conductive material, e.g., a metallic material. In another exemplary embodiment of the present invention, the enclosure comprises a conductive surface. For example, in some embodiments, one side/surface of the enclosure can comprise a conductive material, while other sides/surfaces of the enclosure comprise non-conductive materials. In an exemplary embodiment of the present invention, at least a portion of the enclosure is configured for electrical communication with an asset carrying a voltage. In some embodiments of the present invention, the at least one conductive surface is configured for electrical communication with an asset carrying a voltage. In some embodiments of the present invention, a portion of the enclosure comprises a solder point for use in placing the enclosure in electrical communication with the asset. In some embodiments of the present invention, the enclosure is in electrical communication with the asset such that at least a portion of the enclosure carries a voltage substantially equal to the voltage carried by the asset.

As discussed above, the sensor can comprise a conductive sensor plate. In some embodiments of the present invention, the sensor comprises a single conductive sensor plate, which offers improvement over the prior art. The conductive sensor plate can be many sensor plates known in the art. In an exemplary embodiment of the present invention, the sensor plate is a copper plate. The sensor plate can be positioned adjacent to a conductive surface of the enclosure, such that the conductive plate and the surface of the metallic enclosure are not in contact with each other. In some embodiments an insulator is positioned between the conductive sensor plate and the conductive surface of the enclosure. The insulator can be many insulators known in the art, including, but not limited to, air, plastics, nomex, and the like. The enclosure and sensor plate can be oriented such that when the conductive surface of the enclosure is in electrical communication with the asset, a voltage is induced across the sensor plate and conductive surface consistent with the discussion above.

The sensor can also comprise a signal conditioning circuit. The signal conditioning circuit can be in electrical communication with the sensor plate and the conductive surface of the enclosure. The signal conditioning circuit can be configured to provide an output to the microcontroller unit.

The microcontroller unit can be configured to measure the voltage of the asset based on the output of the signal conditioning circuit. In various embodiments of the present invention, the microcontroller can comprise a processor and memory. The memory can comprise logical instructions executable by the processor for implementing the various algorithms discussed herein. In an exemplary embodiment of the present invention, the memory comprises instructions for carrying out the MAVS algorithm discussed herein. In some embodiments of the present invention, the microcontroller calculates the voltage of the asset and/or the distance from the asset to a surface of the earth.

Figure 12:
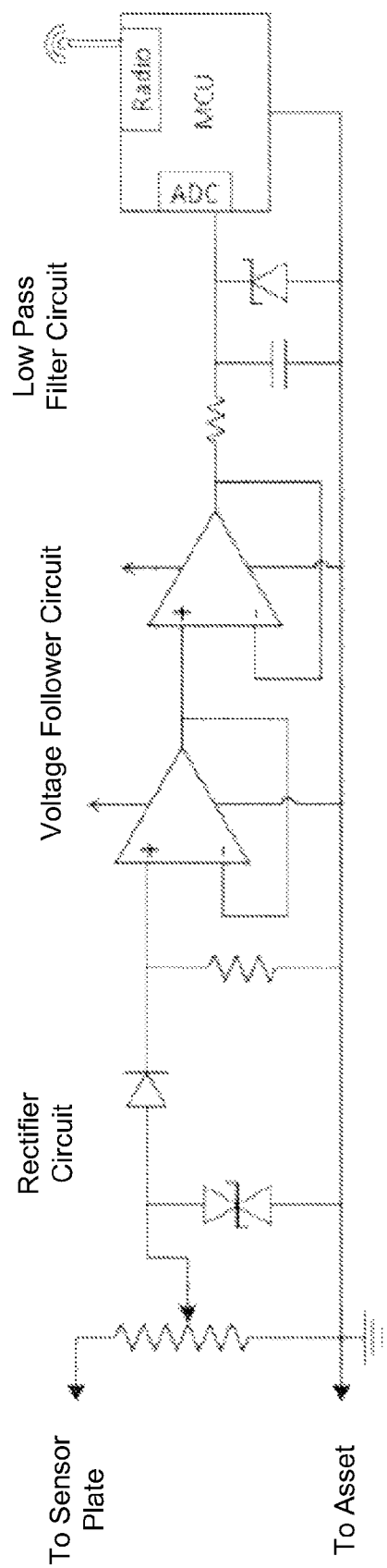
FIG. 12 provides a circuit diagram for a signal conditioning circuit, in accordance with an exemplary embodiment of the present invention.

As shown in FIG. 12, in an exemplary embodiment of the present invention, the signal conditioning circuit comprises a rectifier circuit, a voltage follower circuit, and a low pass filter. The rectifier circuit can be configured to rectify an AC voltage induced on the conductive sensor plate by the asset. The voltage follower circuit can be configured to buffer an output of the rectifier circuit. The low pass filter can be configured to low pass filter an output of the voltage follower circuit. In some embodiments of the present invention, the local electrical ground of the signal conditioning circuit can be substantially equal to the voltage of the asset.

As discussed above, in some exemplary embodiments of the present invention, the sensor further comprises a wireless transceiver. The wireless transceiver can be in communication with the microcontroller unit and configured to transmit a wireless signal indicative of a measurement made by the microcontroller. For example, in some embodiments of the present invention, the wireless transceiver is configured to transmit a wireless signal indicative of the measured voltage of the asset.

In another exemplary embodiment of the present invention, the sensor further comprises a power supply. The power supply can receive electrical power from the asset and provide electric power to the sensor, e.g., power used to operate the microcontroller and/or wireless transceiver.

Various embodiments of the present invention are advantageous over the prior art for many reasons. One such reason is the small size in which embodiments can be implements. Therefore, in some embodiments of the present invention, the signal conditioning circuit and the microcontroller unit can be contained substantially within the enclosure.

In some embodiments of the present invention, the voltage sensor can be suspended from the voltage asset. Therefore, in some embodiments, the sensor is completely supported by the asset. In some embodiments of the present invention, when the sensor is suspended from the asset, the sensor plate is substantially coplanar to the ground (surface of earth) beneath the sensor.

Several features of the present invention are defined to be in electrical communication with other features of the present invention. As used herein, element A is in electrical communication with element B if element A and element B are coupled to each other in such a way that electrical current can pass along a communication path from element A to element B or from element B to element A. Further, electrical communication between two elements may be direct or indirect. As used herein, element A is in direct electrical communication with element B if the communication path between element A and element B has an electrical resistance of substantially zero ohms. As used herein, element A is in indirect electrical communication with element B if the communication path between element A and element B has an electrical resistance with a magnitude greater than substantially zero ohms. Moreover, whenever any two features of the present invention are said to be in electrical communication with each other, the two features may by in electrical communication via an electrical connection element. As used herein and as those skilled in the art would recognize, an electrical connection element can be electrical connection elements known in the art or developed at a later time, including but not limited to, an electrical conductor, a combination of electrical components, e.g. resistors, capacitors, inductors, and the like, an electrical circuit, solder, and the like. Further, an electrical connection element can provide direct or indirect electrical communication between two elements.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A floating voltage sensor system comprising:
   a metallic enclosure configured for electrical communication with an asset carrying a voltage;
   a conductive sensor plate positioned adjacent to a surface of the metallic enclosure, such that the conductive plate and the surface of the metallic enclosure are not in contact with each other;
   a signal conditioning circuit comprising a first connection point and a second connection point, the first connection point in electrical communication with the conductive sensor plate, the second connection point in electrical communication with the metallic enclosure; and
   a microcontroller unit configured to measure the voltage of the asset based on an output of the signal conditioning circuit;
   wherein the microcontroller unit comprises a memory and processor, the memory comprising logical instructions that when executed by the processor cause the microcontroller to:
   calculate the voltage of the asset; and
   calculate a distance of the asset from a surface of the Earth;
   wherein the logical instructions are such that the calculations of the voltage of the asset and the distance of the asset from the surface of the Earth are based in part on:
   historical data of the voltage of the asset and the distance of the asset from the surface of the Earth saved over time in the memory; and
   a voltage across the surface of the metallic enclosure and the conductive sensor plate.

2. The floating voltage sensor system of claim 1, wherein an electrical voltage ground of the signal conditioning circuit is the voltage of the asset.

3. The floating voltage sensor system of claim 1 further comprising an insulator positioned substantially between the metallic enclosure and the conductive sensor plate.

4. The floating voltage sensor system of claim 1, wherein the signal conditioning circuit comprises:
   a rectifier circuit configured to rectify an AC voltage induced on the conductive sensor plate;
   a voltage follower circuit configured to buffer an output of the rectifier circuit; and
   a low pass filter configured to low pass filter an output of the voltage follower circuit.

5. The floating voltage sensor system of claim 1, further comprising a wireless transceiver in communication with the microcontroller unit, the wireless transceiver configured to transmit a wireless signal indicative of the measured voltage of the asset.

6. The floating voltage sensor system of claim 1 further comprising a power supply circuit configured to receive electric power from the asset and provide electric power to the floating voltage sensor.

7. The floating voltage sensor system of claim 6, wherein the signal conditioning circuit and the microcontroller unit are contained substantially within the metallic enclosure.

8. The floating voltage sensor system of claim 1, wherein the floating voltage sensor is completely supported by the asset.

9. A floating voltage sensor system comprising:
   an enclosure having at least one conductive surface, the at least one conductive surface configured for electrical communication with an asset carrying a voltage;
   a single conductive sensor plate positioned adjacent to the at least one conductive surface of the enclosure, such a that an insulator is between the sensor plate and the conductive surface;
   a signal conditioning circuit in electrical communication with the sensor plate and the conductive surface; and
   a microcontroller unit comprising a memory and a processor, the memory comprising logical instructions that when executed by the processor cause the microcontroller unit to generate data indicative of the voltage of the asset based on moving average voltage sensing to compute the value of the voltage of the asset and a distance of the asset from a surface of the Earth for all possible measurement indices of voltage, current and electrical permittivity after an initial determination of the indices.

10. The floating voltage sensor system of claim 9, wherein an electrical voltage ground of the signal conditioning circuit is the voltage of the asset.

11. The floating voltage sensor system of claim 9, wherein the signal conditioning circuit comprises:
    a rectifier circuit configured to rectify an AC voltage induced on the conductive sensor plate;
    a voltage follower circuit configured to buffer an output of the rectifier circuit; and
    a low pass filter configured to low pass filter an output of the voltage follower circuit.

12. The floating voltage sensor system of claim 9 further comprising a wireless transceiver in communication with the microcontroller unit, the wireless transceiver configured to transmit a wireless signal indicative of the measured voltage of the asset.

13. The floating voltage sensor system of claim 9, wherein the logical instructions are such that the calculations of the voltage of the asset and the distance of the asset from the surface of the Earth are based in part on a voltage across the at least one conductive surface of the enclosure and the conductive sensor plate.

14. The floating voltage sensor system of claim 9 further comprising a power supply circuit configured to provide electric power to the floating voltage sensor, wherein the power supply is configured to receive the electric power from the asset.

15. The floating voltage sensor system of claim 9, wherein the signal conditioning circuit and the microcontroller unit are contained substantially within the metallic enclosure.

16. The floating voltage sensor system of claim 9, wherein the floating voltage sensor is completely supported by the asset.

* * * * *